(12) United States Patent
Abe

(10) Patent No.: US 7,766,678 B1
(45) Date of Patent: Aug. 3, 2010

(54) SIM CARD CONNECTOR WITH EJECT MECHANISM

(75) Inventor: Kiyoshi Abe, Cupertino, CA (US)

(73) Assignee: Yamaichi Electronics USA, Inc., San Jose, CA (US)

( * ) Notice: Subject to any disclaimer, the term of this patent is extended or adjusted under 35 U.S.C. 154(b) by 0 days.

(21) Appl. No.: 12/268,310

(22) Filed: Nov. 10, 2008

(51) Int. Cl.
*H01R 13/62* (2006.01)
(52) U.S. Cl. .................................. 439/159
(58) Field of Classification Search ............ 439/159, 439/160, 152
See application file for complete search history.

(56) References Cited
U.S. PATENT DOCUMENTS 5,389,001 A * 2/1995 Broschard et al. .......... 439/159
5,934,920 A * 8/1999 Ito et al. .................... 439/159
2008/0064239 A1* 3/2008 Li .............................. 439/152

* cited by examiner

*Primary Examiner*—Gary F. Paumen
(74) *Attorney, Agent, or Firm*—Squire, Sanders & Dempsey, L.L.P.

(57) ABSTRACT

A card connector having a housing and a card tray with an ejection mechanism for ejecting the card tray from the housing is disclosed. The connector has an ejection member and pivotable ejection lever that act in concert to eject the card tray from the housing. A force applied to the ejection member causes the pivotable ejection lever to pivot, which causes card tray to eject from the housing.

13 Claims, 4 Drawing Sheets

SIM CARD CONNECTOR WITH EJECT MECHANISM

FIELD OF THE INVENTION

The present invention relates to a card connector, in particular, to a memory card connector with a card ejection mechanism.

BACKGROUND OF THE INVENTION

Memory cards for storing data are used in many electronic devices, such as video cameras, digital still cameras, smartphones, PDA's, music players, ATMs, cable television decoders, toys, games, PC adapters, multi-media cards and other electronic applications. A card reader, which typically is part of an electronic device, is used to read data from a memory card and transmit the data to the electronic device. A card reader may also be used to write data from the electronic device to the memory card. A card connector is used to connect a memory card to a card reader. One aspect of the card connectors mounted on such electronic devices is that they have an eject mechanism for removing an inserted card from the connector.

SUMMARY OF THE INVENTION

Various embodiments of the present invention include a card connector comprising: a connector housing; a card tray that is configured to receive a card, wherein the card tray is slidably insertable in the housing; a ejection member slidably coupled to a surface of the housing; and a pivotable ejection lever pivotably coupled to the housing, wherein sliding of the ejection member when the card tray is inserted in the housing is configured to pivot the ejection lever by engaging the ejection lever on a first side of a pivot point, the ejection lever upon pivoting is configured to engage the card tray on a second side of the pivot point to slide the card tray to allow insertion or removal of the card.

DESCRIPTION OF PREFERRED EMBODIMENTS

Figure 1:
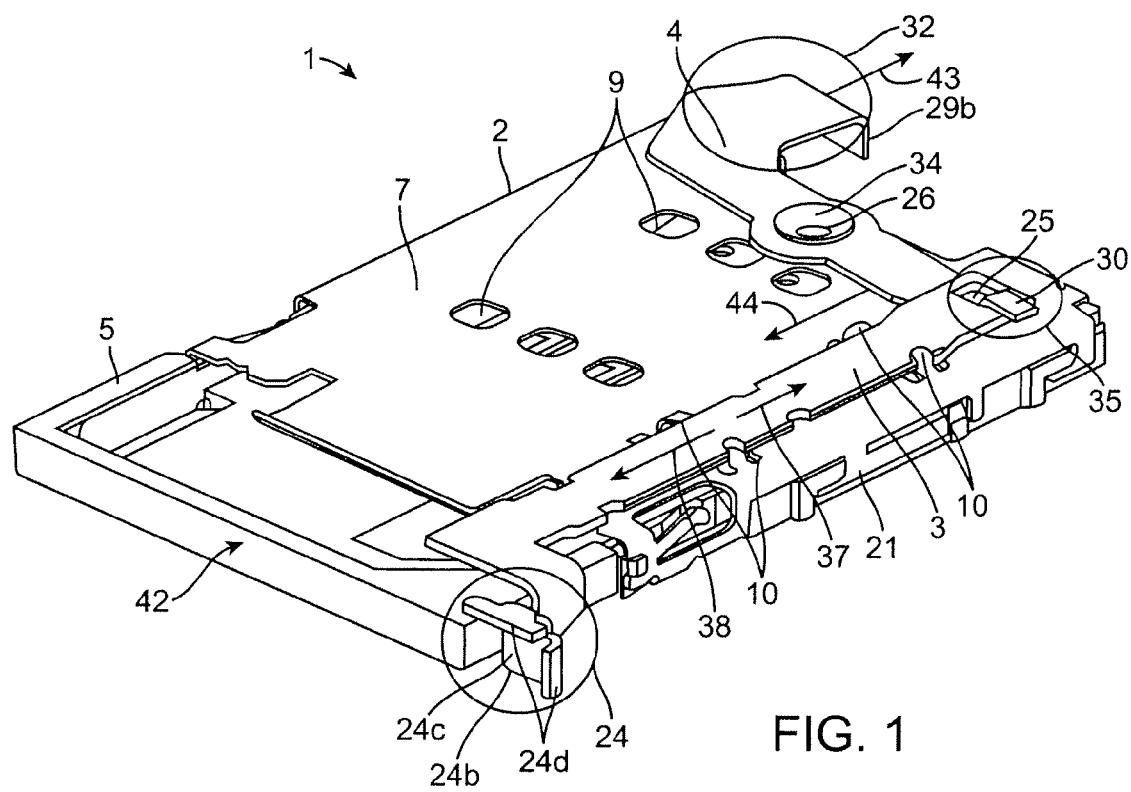
FIG. 1 depicts a perspective view of a card connector of the present invention.
Figure 2:
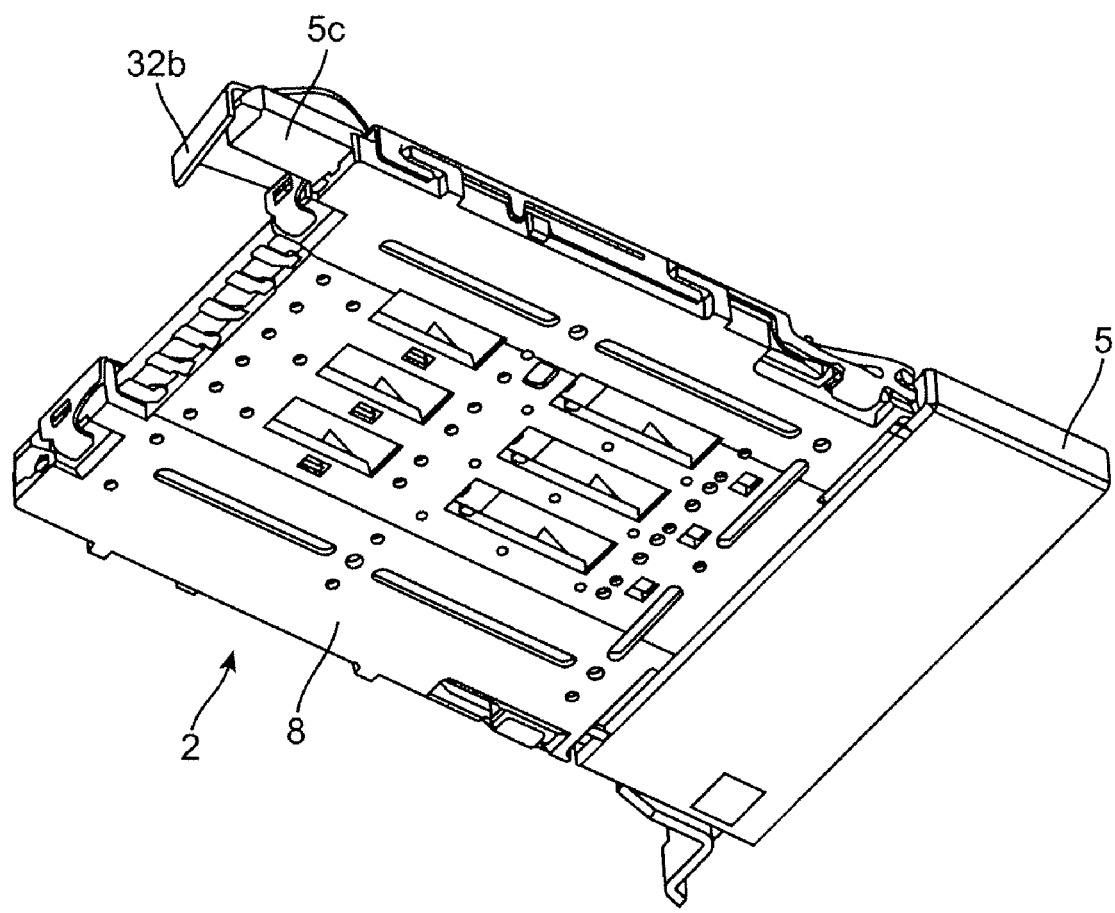
FIG. 2 depicts a bottom view of a card connector of the present invention.
Figure 3:
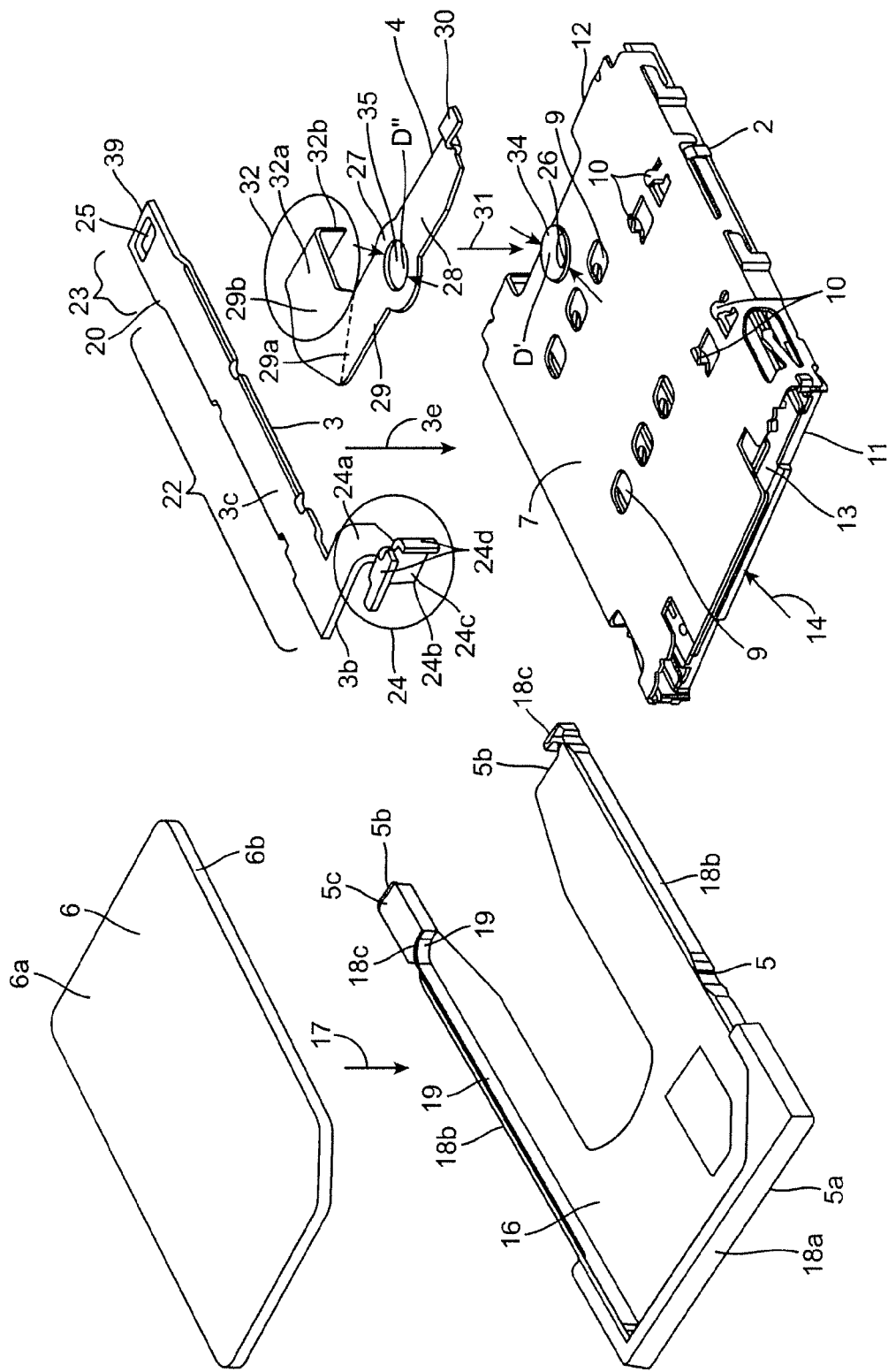
FIG. 3 depicts a card and the components of a card connector of the present invention in a disassembled state.

Embodiments of the present invention will be described in detail by referring to the accompanying drawings. FIG. 1 is a perspective view showing the top and sides of the card connector 1 of the present invention. FIG. 2 is a perspective view showing the bottom of the card connector 1. FIG. 3 depicts the several components of a card connector of the present invention and a card in a disassembled or disassociated state. The components include a shell cover or housing 2, an ejector rod or member 3, a pivotable ejection lever 4, and a card tray 5.

Referring to FIGS. 1-3. The card connector 1 is for mounting on electronic devices such as cell phones, PDAs, portable audio devices and cameras, and an IC card 6 is inserted into card connector 1 with its contact pad side down. Shell cover or housing 2 has a top surface 7 and a bottom surface 8. Housing 2 can be fabricated from metal or plastic. Housing 2 can be constructed of one or more separate structural components, such as a lower and upper housing. Such structures are known in the art and are not illustrated herein. The present invention is readily applicable to a variety of card connector structures known in the art.

Referring to FIGS. 1-3, housing 2 can optionally include various structural components integrated as part of housing 2 such as openings 9 and pairs of flanges 10. Housing 2 has a front end 11 and a rear end 12 with front end 11 having a slotted opening 13 configured to receive card tray 5. Specifically, a rear end 5b of card tray 5 is insertable into an opening 13 of housing 2, as indicated by an arrow 14.

Referring to FIG. 3, card tray 5 is adapted to receive card 6, as shown by an arrow 17. Card 6 has a top surface 6a, a bottom surface (not shown), and an edge surface 6b defining its perimeter. Card tray 5 has a front end 5a, a rear end 5b, and a top surface 16 for supporting a bottom surface of card 6. Card tray 5 further has front walls 18a, side walls 18b, and back rear walls 18c that form a receptacle for enclosing card 6 around its perimeter. Walls 18a, 18 b, and 18c have interior surfaces 19 facing edge surfaces 6b of an inserted card. Interior surfaces 19 can conform to the perimeter of card 6. In some embodiments, the interior surfaces 19 can contact edge surface 6b of an inserted card to provide a friction fit of card 6 in card tray 5.

Card tray 5 has a card tray extension member 5c that is adapted to engage card tray engagement arm 32 of pivotable ejection lever 4 to eject card tray 5 from housing 2, as described in detail herein. Card tray 5 can be formed from a metal or plastic.

Referring to FIGS. 1 and 3, an ejection rod or member 3 is slidably coupled to over top surface 7 of housing 2, as shown by an arrow 3e, and extends from front end 11 to rear end 12 of housing 2. Referring to FIG. 3, ejection member 3 has three sections, a central section 22, a coupling section 23, and a pin receiving section 24. In the embodiment depicted in FIG. 1, ejection member 3 is coupled to top surface 7 of housing 2 by pairs of flanges 10 along central section 22 of ejection member 3. Ejection member 3 is configured to slide along a direction parallel or substantially parallel to an edge surface 21 of housing 2. In particular, ejection member 3 is slidable in a direction from front end 11 to rear end 12 of housing 2, as shown by an arrow 37, and in a direction from rear end 12 to front end 11 of housing 2, and by an arrow 38. Ejection member 3 can be composed of materials such as plastic or metal.

As shown in FIGS. 1 and 3, central section 22 of ejection member 3 is a straight elongate rectangular sheet with a top surface 3c that is slidable on or near top surface 7 of housing 2. The elongate rectangular sheet has a curve 20 at a rear end 3a of ejection member 3, forming coupling section 23, which has a hole 25 between its the top and bottom surfaces. A flange 30 at the end of pivotable ejection lever 4 is insertable into hole 25 to provide coupling of ejection member 3 and pivotable ejection lever 4 at a rotatable coupling area 45.

Referring to FIGS. 1 and 3, a pin receiving section 24 is located at front end 3b of ejection member 3. Pin receiving section 24 of ejection member 3 has an extension member or arm 24a extending perpendicularly from a side edge surface at front end 3b of ejection member 3. Extension member 24a curves perpendiculary to top surface 3c of central section 22. A rectangular plate 24b extends from the curved extension member 24a. A pin contacting surface 24c of rectangular plate 24b faces in a forward direction. Rectangular plate 24b includes flanges 24d to prevent a pin pressed against the pin contacting surface 24c from sliding off.

Referring to FIGS. 1 and 3, pivotable ejection lever 4 is coupled at a pivot point 26 to top surface 7 of housing 2 adjacent to rear end 12 of housing 2, as shown by an arrow 31. Pivotable ejection lever 4 is generally an elongate sheet that includes a central section 27, a flat section 28 on a first side of pivot point 26, flange 30 at the end of the flat section 28, a flat section 29 on a second side of the pivot point 26, and a card tray engagement arm 32 at the end of the flat section 29.

Central section 27 includes a hole 35 that is for use in coupling pivotable ejection lever 4 to housing 2. In particular, a circular coupling member 34 is coupled to top surface 7 of housing 2 near rear end 12 of housing 2. Circular coupling member 34 performs the dual purposes of retaining pivotable ejection lever 4 on housing 2 and allowing pivoting of pivotable ejection lever 4. The means for coupling ejection lever 4 to housing 2 is not limited to that described. Circular coupling member 34 has a diameter D' that is larger than diameter D'' of the opening of hole 35, and thus, retains pivotable ejection lever 4 on housing 2.

As shown in FIGS. 1 and 3, flat section 28 and flat section 29 of pivotable ejection lever 4 have generally flat top and bottom surfaces that are generally parallel to top surface 7 of housing 2 when pivotable ejection lever 4 is coupled to housing 2. As stated above, at the end of flat section 28 is a flange 30 for use in coupling pivotable ejection lever 4 to ejection member 3.

Card tray engagement arm 32 extends perpendicularly from an edge of flat section 29 of pivotable ejection lever 4 and then downward. Specifically, pivotable ejection lever 4 bends upward along a line 29a that is oblique to a width of flat section 29 to form a section 32a that is roughly parallel to flat section 29. Card tray engagement arm 32 bends downward perpendicularly, forming a card tray engagement member or extension 32b that is configured to engage card tray extension member 5c extending from card tray 5. Card tray extension member 5c can be a rod extending or projecting from a rear end 5b of the card tray 2. Card tray extension member 5c may be integrated as part of card tray 5. For example, card tray 5 and card tray extension member 5c can be formed as a single molded part.

Figure 4:
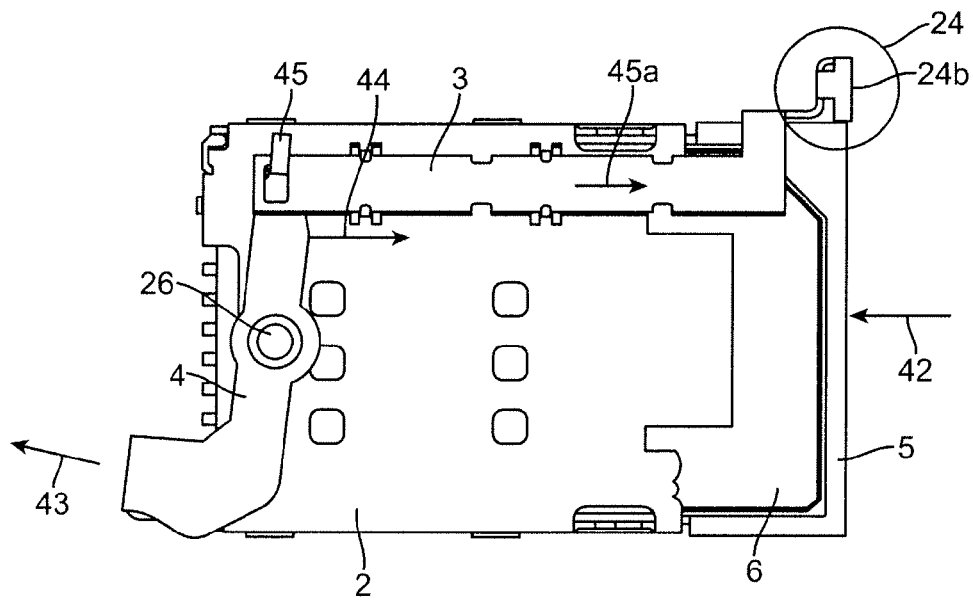
FIG. 4 depicts a top view of the card connector of the present invention in a card inserted state.
Figure 5:
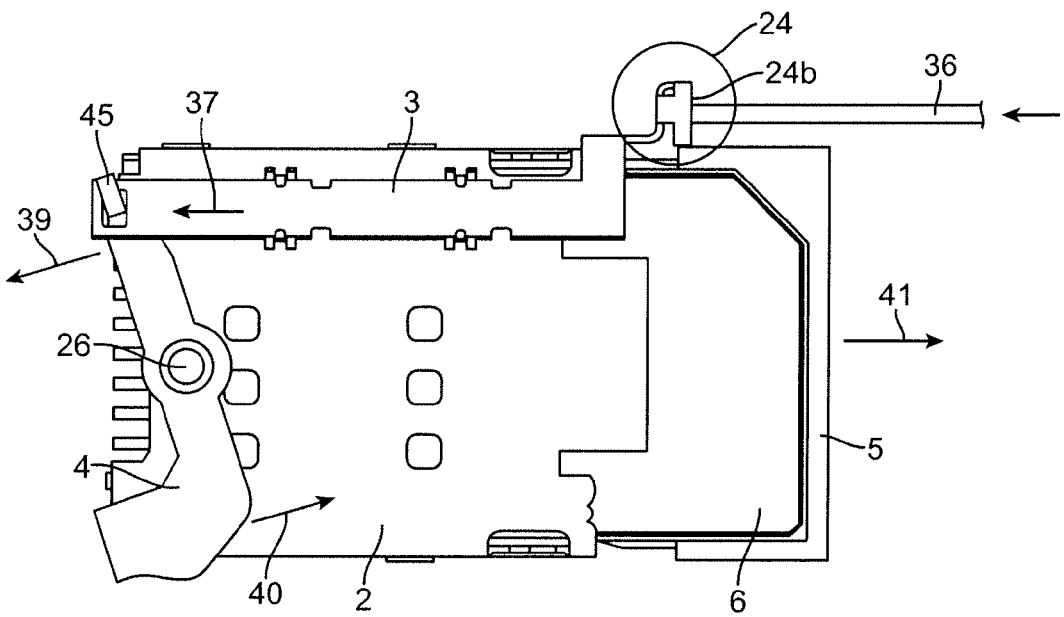
FIG. 5 depicts a top view of the card connector of the present invention in a card ejected state.

FIG. 4 depicts a top of the assembled card connector in a card inserted state. In the card inserted state, card tray 5 containing the card 6 is fully inserted in housing 2. FIG. 5 depicts a top view of the assembled card connector in a card ejected state. In the card ejected state, card tray 5 containing card 6 is shown to be partially outside of card tray 5.

In order to make the transition from the card inserted state to the card ejected state, (i.e., eject card tray 5 from housing 2), a force is applied to pin contacting surface 24c of rectangular plate 24b of pin receiving section 24 in a direction parallel to a longitudinal axis of ejection member 3. The force can be applied using any member having a cross section small enough to apply to pin contacting surface 24c, such as a paper clip or tip of a writing implement.

Arrows illustrating the movement of the various components from the card inserted state to the card ejected state are shown in FIG. 5. The force applied is sufficient to cause sliding of ejection member 3, as shown by arrow 37. The sliding of ejection member 3 applies a force to pivotable ejection lever 4 at connection area 45, causing pivotable ejection lever 4 to pivot about pivot point 26, as shown by arrows 39 and 40. As ejection lever 4 pivots, card tray engagement member 32b of ejection lever 4 engages card tray extension member 5b extending from card tray 5 causing card tray 5 to slide in the direction shown by arrow 41 and eject from housing 2.

In order to transition from the card ejected state to the card inserted state, a force is applied to a front surface of wall 18a of card tray 5 to cause card tray 5 to slide into housing 2, as shown by an arrow 42 in FIGS. 1 and 4. As card tray 5 slides, card tray extension member 5b engages card tray engagement member 32b of pivotable ejection lever 4 and causes it to pivot, as shown by arrows 43 and 44 in FIG. 4. The pivoting of ejection lever 4 applies a force to ejection member 3 at connection area 45, causing ejection member 3 to slide, as shown by an arrow 45 in FIG. 4. Card tray 5 slides as described until it is in the card inserted condition.

While particular embodiments of the present invention have been shown and described, it will be obvious to those skilled in the art that changes and modifications can be made without departing from this invention in its broader aspects. Therefore, the appended claims are to encompass within their scope all such changes and modifications as fall within the true spirit and scope of this invention.

The invention claimed is:

1. A card connector comprising:
   a connector housing;
   a card tray that is configured to receive a card, wherein the card tray is slidably insertable in the housing;
   an ejection member slidably coupled to a surface of the housing; and
   a pivotable ejection lever pivotably coupled to the housing,
   wherein the ejection member upon sliding is configured to pivot the pivotable ejection lever by engaging the pivotable ejection lever on a first side of a pivot point,
   wherein the ejection lever upon pivoting is configured to engage the card tray in an inserted position on a second side of the pivot point of the ejection lever to slide the card tray to an ejected position that allows insertion or removal of the card, and
   wherein the pivotable ejection lever is pivotably coupled to a top surface of the housing.

2. The connector of claim 1, wherein the housing covers the card in the card tray when the card tray is inserted in the housing.

3. The connector of claim 1, wherein the ejection member comprises a pin receiving area at one end configured to allow engagement of a pin with a pin receiving surface, wherein engagement of the pin with the pin receiving surface slides the ejection member.

4. The connector of claim 1, wherein the ejection member is coupled to the ejection lever on the first side of the pivot point.

5. The connector of claim 1, wherein the ejection member is an elongate member extending from a front end to a rear end of the housing.

6. The connector of claim 1, wherein the pivotable ejection lever comprises a flange on the second side of the pivot point that engages the card tray.

7. The connector of claim 1, wherein the pivotable ejection lever engages an extension projecting from a rear end of the card tray when the pivotable ejection lever pivots.

8. The connector of claim 1, wherein the ejection member is slidable from a front end of the housing to a rear end of the housing to cause the pivoting of the ejection lever.

9. The connector of claim 1, wherein the ejection member is slidable from a rear end of the housing to a front end of the housing to pivot the ejection lever causing the card tray when in an ejected position to be inserted into the housing.

10. The connector of claim 1, wherein the pivotable ejection lever comprises an arm extending perpendicularly from an end of the pivotable ejection lever on the second side of the pivot point, the arm comprising a downward extension configured to engage the card tray.

11. A card connector comprising:
a connector housing;
a card tray that is configured to receive a card, wherein the card tray is slidably insertable in the housing;
an ejection member slidably coupled to a surface of the housing; and
a pivotable ejection lever pivotably coupled to the housing,
wherein the ejection member upon sliding is configured to pivot the pivotable ejection lever by engaging the pivotable ejection lever on a first side of a pivot point,
wherein the ejection lever upon pivoting is configured to engage the card tray in an inserted position on a second side of the pivot point of the ejection lever to slide the card tray to an ejected position that allows insertion or removal of the card,
wherein the ejection member comprises a pin receiving area at one end configured to allow engagement of a pin with a pin receiving surface, wherein engagement of the pin with the pin receiving surface slides the ejection member, and
wherein the pin receiving area comprises at least one flange to prevent an engaged pin from slipping off of the pin receiving surface.

12. A card connector comprising:
a connector housing;
a card tray that is configured to receive a card, wherein the card tray is slidably insertable in the housing;
an ejection member slidably coupled to a surface of the housing; and
a pivotable ejection lever pivotably coupled to the housing,
wherein the ejection member upon sliding is configured to pivot the pivotable ejection lever by engaging the pivotable ejection lever on a first side of a pivot point,
wherein the ejection lever upon pivoting is configured to engage the card tray in an inserted position on a second side of the pivot point of the ejection lever to slide the card tray to an ejected position that allows insertion or removal of the card, and
wherein pairs of flanges integral to the surface of the housing couple the ejection member thereon.

13. A card connector comprising:
a connector housing;
a card tray that is configured to receive a card, wherein the card tray is slidably insertable in the housing;
an ejection member slidably coupled to a surface of the housing; and
a pivotable ejection lever pivotably coupled to the housing,
wherein the ejection member upon sliding is configured to pivot the pivotable ejection lever by engaging the pivotable ejection lever on a first side of a pivot point,
wherein the ejection lever upon pivoting is configured to engage the card tray in an inserted position on a second side of the pivot point of the ejection lever to slide the card tray to an ejected position that allows insertion or removal of the card, and
wherein the ejection member is slidably coupled to a top surface of the housing.

* * * * *